(12) United States Patent
Tanobe

(10) Patent No.: US 12,322,668 B2
(45) Date of Patent: Jun. 3, 2025

(54) PACKAGE AND MANUFACTURING METHOD OF THE SAME

(71) Applicant: Nippon Telegraph and Telephone Corporation, Tokyo (JP)

(72) Inventor: Hiromasa Tanobe, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 506 days.

(21) Appl. No.: 17/765,662

(22) PCT Filed: Aug. 3, 2020

(86) PCT No.: PCT/JP2020/029665
§ 371 (c)(1),
(2) Date: Mar. 31, 2022

(87) PCT Pub. No.: WO2022/029838
PCT Pub. Date: Feb. 10, 2022

(65) Prior Publication Data
US 2022/0384285 A1 Dec. 1, 2022

(51) Int. Cl.
*H01L 23/02* (2006.01)
*H01L 21/52* (2006.01)
*H01L 23/14* (2006.01)
*H01L 23/495* (2006.01)
*H01L 23/528* (2006.01)
*H01L 23/66* (2006.01)

(52) U.S. Cl.
CPC ............ *H01L 23/142* (2013.01); *H01L 21/52* (2013.01); *H01L 23/02* (2013.01); *H01L 23/49541* (2013.01); *H01L 23/49586* (2013.01); *H01L 23/528* (2013.01); *H01L 23/66* (2013.01)

(58) Field of Classification Search
CPC ....... H01L 23/142; H01L 21/52; H01L 23/02; H01L 23/49541; H01L 23/49586; H01L 23/528; H01L 23/66
USPC ......................................................... 257/678
See application file for complete search history.

(56) References Cited

U.S. PATENT DOCUMENTS

2013/0128489 A1* 5/2013 Satake ..................... H05K 7/02
361/820
2016/0104650 A1* 4/2016 Tsujino ................ H01L 33/483
174/541

FOREIGN PATENT DOCUMENTS

WO 2015029880 A1 3/2015

OTHER PUBLICATIONS

Physical and Link Layer (PLL) Working Group, "Implementation Agreement for Intradyne Coherent Receivers", IA # OIF-DPC-RX-01, Implementation Agreement to be revised and approved by the Optical Internetworking Forum, Sep. 20, 2011, 21 pages.

(Continued)

*Primary Examiner* — Ori Nadav
(74) *Attorney, Agent, or Firm* — Slater Matsil, LLP

(57) ABSTRACT

A first frame includes portions of a first short side surface and a first long side surface, in which a plurality of conductor layers to which a plurality of DC electrode terminals are connected, and a plurality of insulating layers arranged between the plurality of conductor layers are stacked. Further, a second frame includes portions of a second short side surface and a second long side surface.

20 Claims, 11 Drawing Sheets

(56) References Cited

OTHER PUBLICATIONS

Physical and Link Layer (PLL) Working Group, "Implementation Agreement for Intradyne Coherent Receivers", IA # OIF-DPC-RX-01.2, Implementation Agreement to be revised and approved by the Optical Internetworking Forum, Nov. 14, 2013, 25 pages.
Physical and Link Layer (PLL) Working Group, "Implementation Agreement for High Bandwidth Coherent Driver Modulator (HB-CDM)", IA # OIF-HB-CDM-01.0, Implementation Agreement created and approved by the Optical Internetworking Forum, Nov. 30, 2018, 27 pages.

* cited by examiner

PACKAGE AND MANUFACTURING METHOD OF THE SAME

CROSS-REFERENCE TO RELATED APPLICATIONS

This application is a national phase entry of PCT Application No. PCT/JP2020/029665, filed on Aug. 3, 2020, which application is hereby incorporated herein by reference.

TECHNICAL FIELD

The present invention relates to a package for a high-frequency signal device and a manufacturing method of the same.

BACKGROUND

In a device configured to process a high-speed differential signal, including digital coherent optical transmission, a high-frequency signal device package including a differential coplanar line in which two ground lines are arranged across two signal lines adjacent to each other is used.

A package of this type needs to satisfy standards defined by OIF (Optical Internetworking Forum). As the standards of this package, CDM (Coherent Driver Modulator) and ICR (Intradyne Coherent Receiver) exist (see non-patent literatures 1, 2, and 3).

RELATED ART LITERATURE

Non-Patent Literature

Non-Patent Literature 1: Physical and Link Layer (PLL) Working Group, Implementation Agreement for High Bandwidth Coherent Driver Modulator, Implementation Agreement created and approved by the Optical Internetworking Forum, 2018.

Non-Patent Literature 2: Physical and Link Layer (PLL) Working Group, "Implementation Agreement for Intradyne Coherent Receivers IA #OIF-DPC-RX-01.1", Implementation Agreement to be revised and approved by the Optical Internetworking Forum, 2011.

Non-Patent Literature 3: Physical and Link Layer (PLL) Working Group, "Implementation Agreement for Intradyne Coherent Receivers IA #OIF-DPC-RX-01.2", Implementation Agreement to be revised and approved by the Optical Internetworking Forum, 2013.

SUMMARY

Problem to be Solved

In the ICR described in OIF standard specifications, 20 DC lead pins are provided on each of the left and right sides of a package in the longitudinal direction. In the CDM, 40 DC lead pins are provided on one side. To wire DC lines connected to the 40 DC lead pins independently by conductor layers that form a ceramic package housing, the number of conductor layers in the CDM is almost twice as large as the number of conductor layers for DC lines needed in the ICR because all DC lead pins are arranged on one side. This means that the number of ceramic layers arranged between the conductor layers also increases to almost twice. The cost of the ceramic package is generally in proportion to the number of layers of the ceramic package housing. Hence, the package occupies most of the cost in the CDM as compared to the cost in the ICR, and a reduction in cost is desired.

As described above, conventionally, in the CDM, package manufacturing at a low cost is difficult as compared to the ICR because the number of stacked layers of an insulator increases, although the same insulator material is used.

Embodiments of the present invention have been made to solve the above-described problem, and have as their object to manufacture a package of CDM at a lower cost.

Solution to the Problem

According to embodiments of the present invention, there is provided a manufacturing method of a package including a rectangular floor portion including a long side and a short side, a first short side surface and a second short side surface arranged on respective portions of two short sides of the floor portion, which are in an opposite position to each other, and a first long side surface and a second long side surface arranged on respective portions of two long sides of the floor portion, which are in an opposite position to each other, a plurality of high-frequency internal terminals arrayed in an internal terminal portion on an inner side of the first short side surface and connected to a high-frequency optical device mounted inside, a plurality of high-frequency external terminals arrayed in a first external terminal portion on an outer side of the floor portion on an outer side of the first short side surface and connected to the internal terminals and connected to lead pins, and a plurality of DC electrode terminals arrayed in a second external terminal portion on an outer side of the first long side surface, the method comprising a first step of producing a first frame having an "L" shape in a planar view and including portions of the first short side surface and the first long side surface, in which a plurality of conductor layers to which the plurality of DC electrode terminals are connected, and a plurality of insulating layers arranged between the plurality of conductor layers are stacked, a second step of producing a second frame having an "L" shape in a planar view and including portions of the second short side surface and the second long side surface, a third step of producing a plate-shaped base material serving as the floor portion, and a fourth step of combining the first frame, the second frame, and the base material to form the package.

According to embodiments of the present invention, there is also provided a package comprising a rectangular floor portion including a long side and a short side, a first short side surface and a second short side surface arranged on respective portions of two short sides of the floor portion, which are in an opposite position to each other, and a first long side surface and a second long side surface arranged on respective portions of two long sides of the floor portion, which are in an opposite position to each other, a plurality of high-frequency internal terminals arrayed in an internal terminal portion on an inner side of the first short side surface and connected to a high-frequency optical device mounted inside, a plurality of high-frequency external terminals arrayed in a first external terminal portion on an outer side of the floor portion on an outer side of the first short side surface and connected to the internal terminals and connected to lead pins, and a plurality of DC electrode terminals arrayed in a second external terminal portion on an outer side of the first long side surface, comprising a first frame having an "L" shape in a planar view and including portions of the first short side surface and the first long side surface, in which a plurality of conductor layers to which the plurality of DC electrode terminals are connected, and a plurality of insulating layers arranged between the plurality of conductor layers are stacked, a second frame having an "L" shape in a planar view and including portions of the second short side surface and the second long side surface, and a plate-shaped base material serving as the floor portion.

Effect of Embodiments of the Invention

As described above, according to embodiments of the present invention, since the multilayer structure of the plurality of conductor layers and the plurality of insulating layers forms only the portion of the first frame, a package of CDM can be manufactured at a lower cost.

DETAILED DESCRIPTION OF ILLUSTRATIVE EMBODIMENTS

A package according to an embodiment of the present invention and a manufacturing method of the same will be described below.

First Embodiment

A manufacturing method of a package according to the first embodiment of the present invention will be described first with reference to FIGS. 1A to 1J.

First, a first frame having an "L" shape in a planar view (e.g., top-down view) is produced.

Figure 1A:
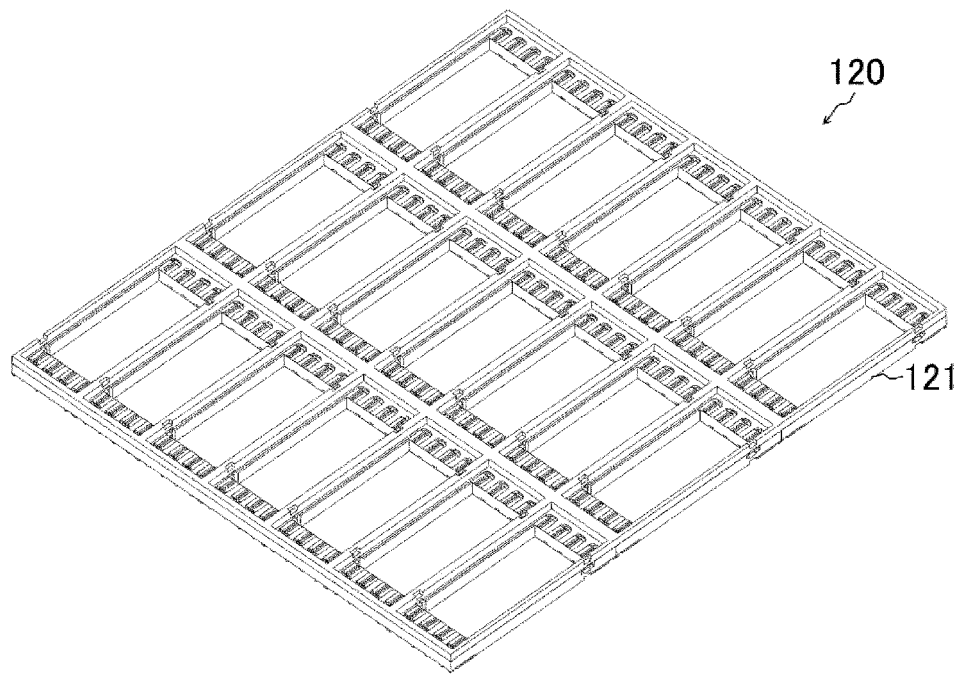
FIG. 1A is a perspective view showing the state of a package in a middle step so as to explain a manufacturing method of a package according to a first embodiment of the present invention.
Figure 1B:
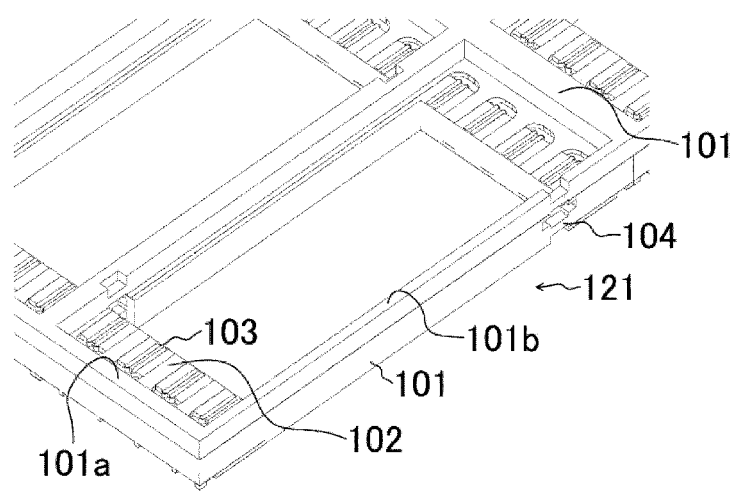
FIG. 1B is a perspective view showing the state of the package in a middle step so as to explain the manufacturing method of the package according to the first embodiment of the present invention.

For example, as shown in FIGS. 1A and 1B, an assembly 120 in which a plurality of frame assemblies 121 each forming two first frames 101 are integrated is produced. In the frame assembly 121, the two first frames 101 rotated by 180° with respect to each other in a planar view are integrated.

For example, a polyvinyl-based binder and a surfactant are added to powder (having an average particle size of, for example, 0.5 to 0.6 μm) of a predetermined metal oxide such as $Al_2O_3$, and these are dispersed in a dispersion medium made of an organic solvent such as 2-propanol, thereby producing a slurry. The produced slurry is molded by, for example, a doctor blade method to form a layer of slurry, and the layer of slurry is dried by removing the dispersion medium from it, thereby forming a green sheet.

Further, a conductive paste in which fine particles of a metal such as tungsten are dispersed is applied, thereby producing a conductor layer sheet. On the conductor layer sheet, a paste pattern formed by the conductive paste and serving as a wiring pattern is formed.

Next, a plurality of conductive sheets and green sheets are alternately stacked, thereby producing a multilayer sheet before sintering, which becomes the above-described assembly 120. After that, the multilayer sheet is baked at a temperature of about 900° C. to 1,000° C., thereby obtaining the assembly 120 that integrates a plurality of first frames 101 in which a plurality of conductor layers 131 and a plurality of insulating layers 132 arranged between the plurality of conductor layers 131 are stacked.

Figure 1C:
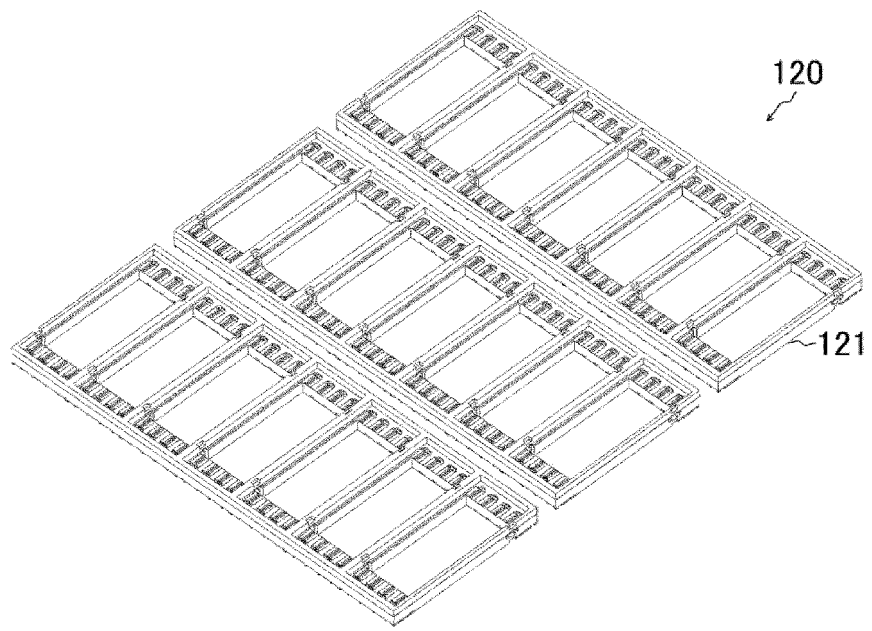
FIG. 1C is a perspective view showing the state of the package in a middle step so as to explain the manufacturing method of the package according to the first embodiment of the present invention.
Figure 1D:
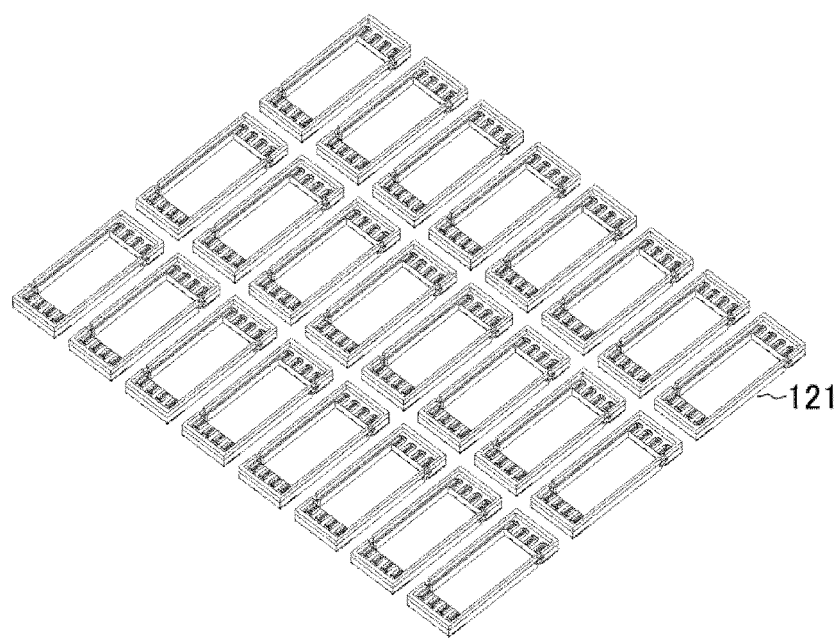
FIG. 1D is a perspective view showing the state of the package in a middle step so as to explain the manufacturing method of the package according to the first embodiment of the present invention.
Figure 1E:
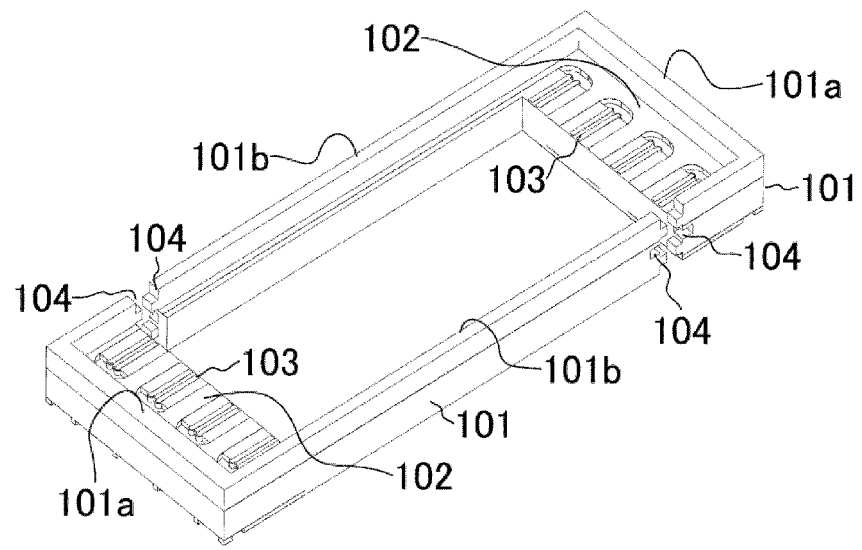
FIG. 1E is a perspective view showing the state of the package in a middle step so as to explain the manufacturing method of the package according to the first embodiment of the present invention.

The thus produced assembly 120 is divided into a plurality of parts, for example, as shown in FIG. 1C, and each of the divided parts of the assembly 120 is divided into the frame assemblies 121 (FIG. 1D). As a result, as shown in FIG. 1E, the first frame 101 having an "L" shape in a planar view and including a first short side surface (side wall) 101*a* and a first long side surface (side wall) 101*b* can be produced. The first short side surface 101*a* and the first long side surface 101*b* are, for example, perpendicular to each other in a planar view.

In each first frame 101, a plurality of conductor layers 131 to which a plurality of DC electrode terminals are connected, and a plurality of insulating layers 132 arranged between the plurality of conductor layers 131 are stacked. The DC electrode terminal will be described later. In addition, a plurality of high-frequency internal terminals 103 are formed in an internal terminal portion 102 on the inner side of the first short side surface 101*a*. Also, in this example, each first frame 101 includes a first joint 104 used to join a second frame 105 (to be described later). In the first embodiment, when the frame assembly 121 is divided, two first frames 101 can be produced. The first frame 101 is formed by a sintered body in which layers of ceramic and conductor layers are stacked.

Figure 1F:
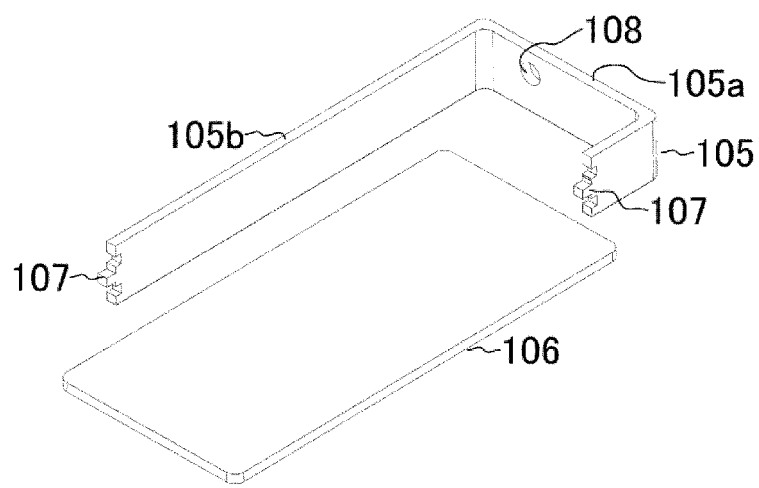
FIG. 1F is a perspective view showing the state of the package in a middle step so as to explain the manufacturing method of the package according to the first embodiment of the present invention.

Next, as shown in FIG. 1F, the second frame 105 having an "L" shape in a planar view and including a second short side surface (side wall) 105*a* and a second long side surface (side wall) 105*b* is produced. The second short side surface 105*a* and the second long side surface 105*b* are, for example, perpendicular to each other in a planar view. In this example, the second frame 105 includes a second joint 107 used to join the first frame 101. In the second frame 105, the second short side surface 105*a* includes a through hole 108. The through hole 108 can be used as an optical signal input/output window for a high-frequency optical device stored (mounted) in the package. In addition, a plate-shaped base material 106 serving as a floor portion is produced. The floor portion will be described later. The second frame 105 and the base material 106 can be made of, for example, Kovar (that, is an alloy of iron, cobalt, and nickel). Kovar is an alloy having, as its characteristic, a linear expansion coefficient close to ceramic. In addition, from the viewpoint of heat dissipation of the high-frequency optical device mounted in the package, CuW (that, is an alloy of copper and tungsten) is often used as the base material 106. As a characteristic, CuW has a high thermal conductivity and a low linear expansion coefficient, and can be used as a peripheral material of ceramic or Kovar.

Figure 1G:
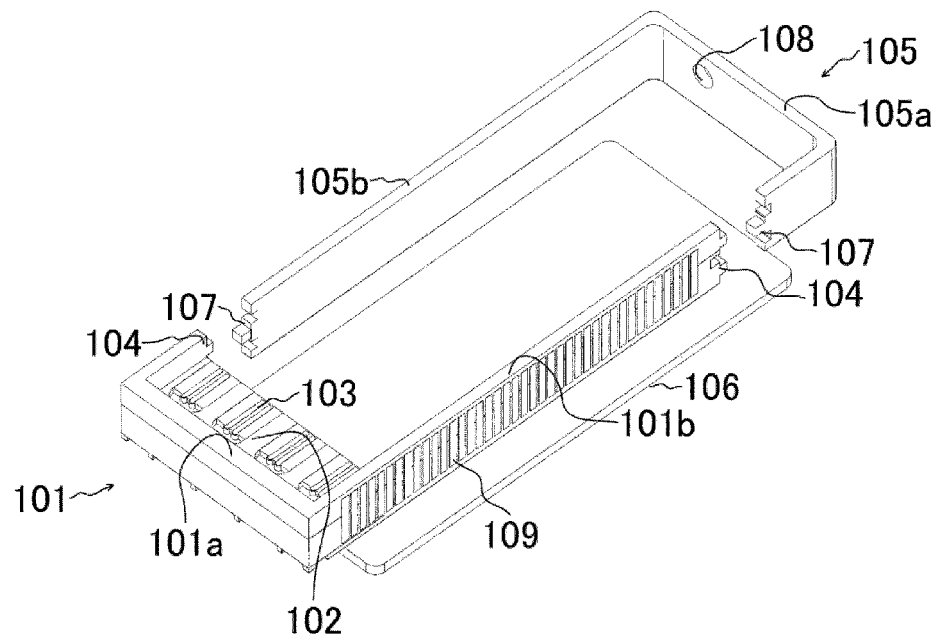
FIG. 1G is a perspective view showing the state of the package in a middle step so as to explain the manufacturing method of the package according to the first embodiment of the present invention.
Figure 1H:
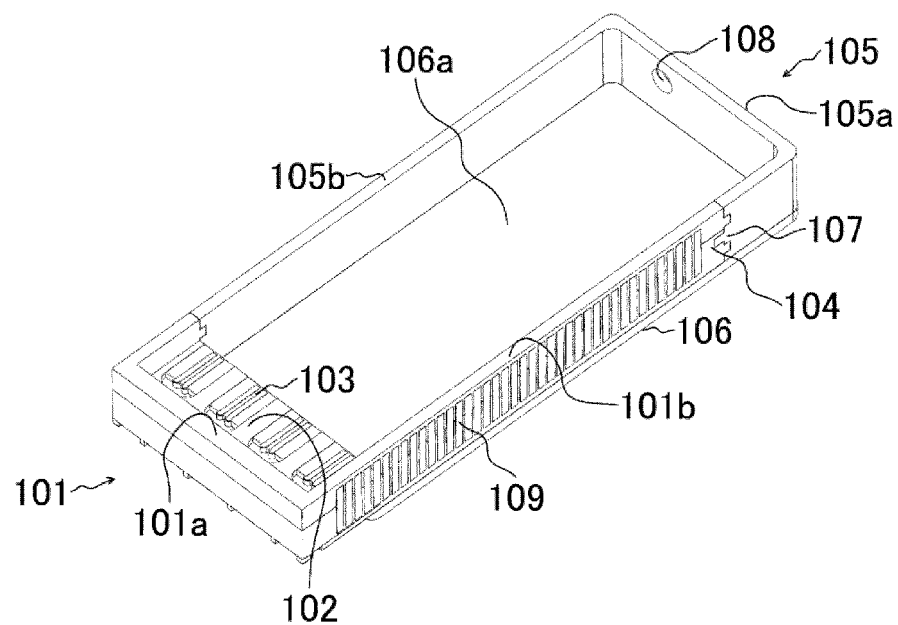
FIG. 1H is a perspective view showing the state of the package in a middle step so as to explain the manufacturing method of the package according to the first embodiment of the present invention.

Next, as shown in FIG. 1G, the plurality of DC electrode terminals 109 are formed on the outer surface of the first long side surface 101*b*. Next, as shown in FIG. 1H, the first frame 101, the second frame 105, and the base material 106 are combined to form a package. In this example, the first joint 104 of the first frame 101 and the second joint 107 of the second frame 105 are tenon-jointed, thereby combining the first frame 101 and the second frame 105. Although a tenon joint is used in this example, permanent connection of planes using silver solder or the like can also be implemented. For example, a first joint surface is provided in the joint portion of the first frame 101 to the second frame 105 and a second joint surface is provided in the joint portion of the second frame 105 to the first frame 101. The first joint surface and the second joint surface are permanently jointed, thereby combining the first frame tot and the second frame 105.

The package includes a rectangular floor portion 106*a* including a long side and a short side, the first short side surface iota and the second short side surface 105*a* arranged on the portions of the short sides of the floor portion 106*a*, and the first long side surface 101*b* and the second long side surface 105*b* arranged on the portions of the long sides of the floor portion 106*a*. The first short side surface iota and the second short side surface 105*a* are arranged on the portions of the two short sides of the floor portion 106*a*, which are in an opposite position to each other. The first long side surface 101*b* and the second long side surface 105*b* are arranged on the portions of the two long sides of the floor portion 106*a*, which are in an opposite position to each other.

Also, the package includes the plurality of high-frequency internal terminals 103 arrayed in the internal terminal portion 102 on the inner side of the first short side surface iota and connected to the high-frequency optical device mounted inside. In addition, the package includes a plurality of high-frequency external terminals (not shown) arrayed in a first external terminal portion on the outer side of the floor portion 106*a* on the side of the first short side surface iota and connected to the high-frequency internal terminals 103 and connected to lead pins. In addition, the package includes the plurality of DC electrode terminals 109 arrayed in a second external terminal portion on the outer side of the first long side surface 101*b*.

Here, the package is formed by the first frame 101 having an "L" shape in a planar view, the second frame 105 having an "L" shape in a planar view, and the base material 106 serving as the floor portion 106*a*, as described above. The first frame tot includes the portions of the first short side surface iota and the first long side surface 101*b*, in which a plurality of conductor layers to which the plurality of DC electrode terminals 109 are connected, and a plurality of insulating layers arranged between the plurality of conductor layers are stacked. Further, the second frame 105 includes the portions of the second short side surface 105*a* and the second long side surface 105*b*, and does not have a structure including alternately stacked insulating layers and conductor layers.

Also, in this example, the first frame tot includes the first joint 104 provided in the joint portion to the second frame 105, the second frame 105 includes the second joint 107 provided in the joint portion to the first frame 101, and the first joint 104 of the first frame tot and the second joint 107 of the second frame 105 are tenon-jointed. Although a tenon joint is used in this example, permanent connection of planes using silver solder or the like can also be implemented, as described above.

In the package according to the first embodiment, a high-frequency optical device or an optical component can be mounted in a bathtub structure on the floor portion 106*a* surrounded by the first frame 101 and the second frame 105.

Figure 1I:
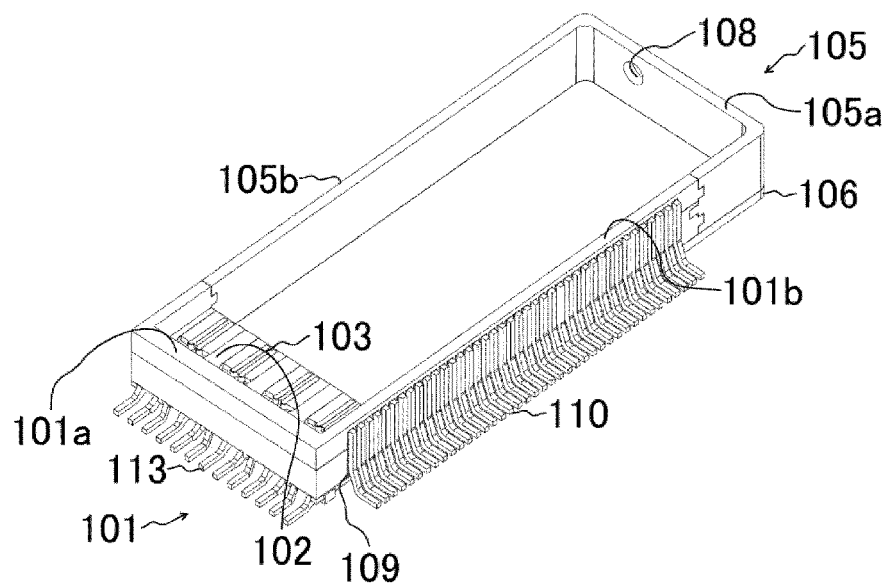
FIG. 1I is a perspective view showing the state of the package in a middle step so as to explain the manufacturing method of the package according to the first embodiment of the present invention.
Figure 1J:
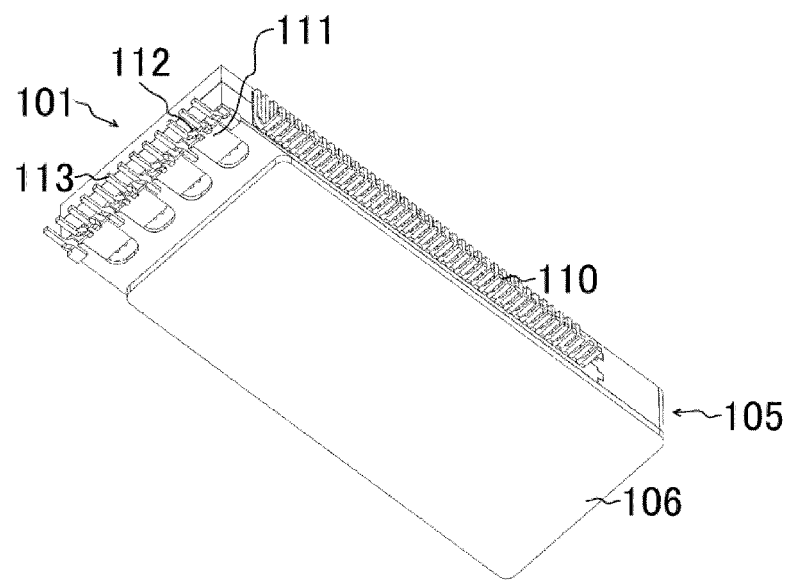
FIG. 1J is a perspective view showing the state of the package in a middle step so as to explain the manufacturing method of the package according to the first embodiment of the present invention.

Note that as shown in FIGS. 1I and 1J, DC lead pins 110 are connected to the plurality of DC electrode terminals 109. In addition, a plurality of high-frequency external terminals 112 are arrayed in a first external terminal portion 111 on the outer side of the floor portion 106*a* on the side of the first short side surface 101a, and RF lead pins 113 are connected to the plurality of high-frequency external terminals 112.

As described above, according to the first embodiment, the multilayer structure of the plurality of conductor layers and the plurality of insulating layers is formed only in the portion of the first frame. It is therefore possible to manufacture a package of CDM at a lower cost.

Second Embodiment

A manufacturing method of a package according to the second embodiment of the present invention will be described next with reference to FIGS. 2A to 2J.

First, a first frame having an "L" shape in a planar view is produced.

Figure 2A:
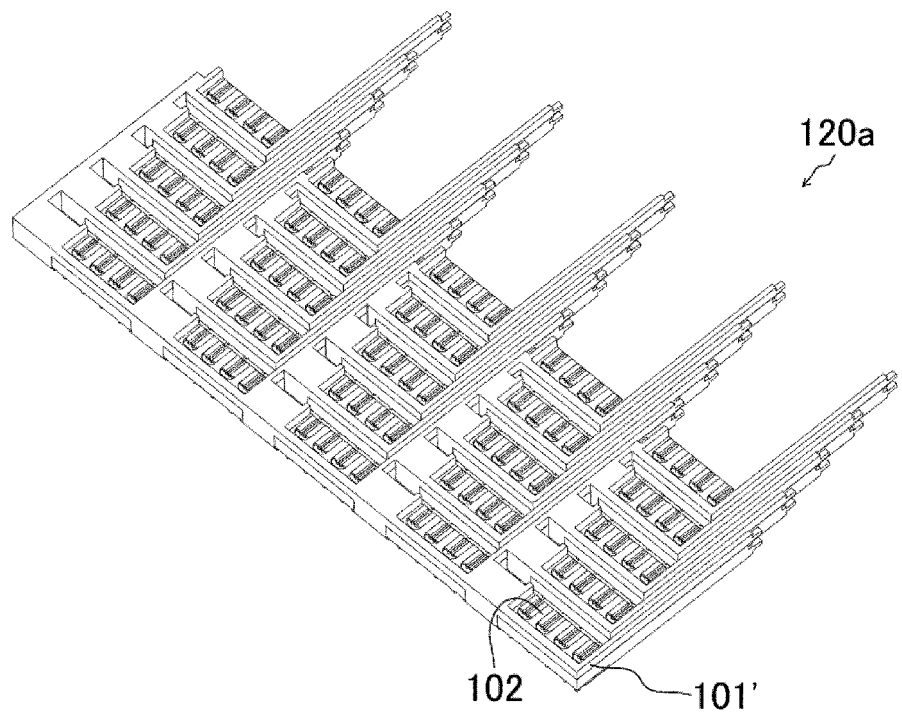
FIG. 2A is a perspective view showing the state of a package in a middle step so as to explain a manufacturing method of a package according to a second embodiment of the present invention.
Figure 2B:
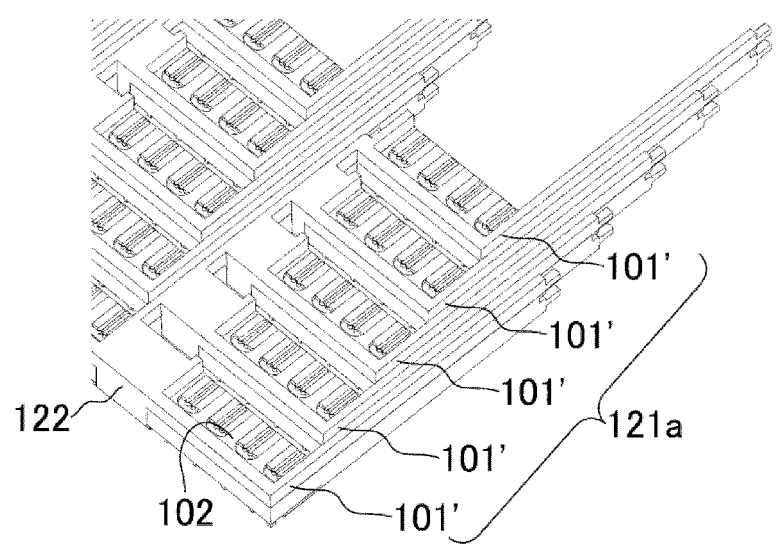
FIG. 2B is a perspective view showing the state of the package in a middle step so as to explain the manufacturing method of the package according to the second embodiment of the present invention.

For example, as shown in FIGS. 2A and 2B, an assembly 120a in which a plurality of frame assemblies 121a each forming a plurality of first frames 101' are integrated is produced. In the frame assembly 121a, the plurality of first frames 101' are stacked and integrally connected by connecting portions 122 while holding such a positional relationship that the first frames are translated in the direction of the long side of the package in a planar view such that an internal terminal portion 102 is visible from the outside.

For example, a polyvinyl-based binder and a surfactant are added to powder of a predetermined metal oxide such as $Al_2O_3$, and these are dispersed in a dispersion medium, thereby producing a slurry. The produced slurry is molded to form a layer of slurry, and the layer of slurry is dried by removing the dispersion medium from it, thereby forming a green sheet.

Further, a conductive paste in which fine particles of a metal such as tungsten are dispersed is applied, thereby producing a conductor layer sheet. On the conductor layer sheet, a paste pattern formed by the conductive paste and serving as a wiring pattern is formed.

Next, a plurality of conductive sheets and green sheets are alternately stacked, thereby producing a multilayer sheet before sintering, which becomes the above-described assembly 120a. After that, the multilayer sheet is baked at a temperature of about 900° C. to 1,000° C., thereby obtaining the assembly 120a in which a plurality of first frame 101', which are formed by stacking a plurality of conductor layers 131 and a plurality of insulating layers 132 arranged between the plurality of conductor layers 131, are connected by the connecting portions 122 and integrated.

Figure 2C:
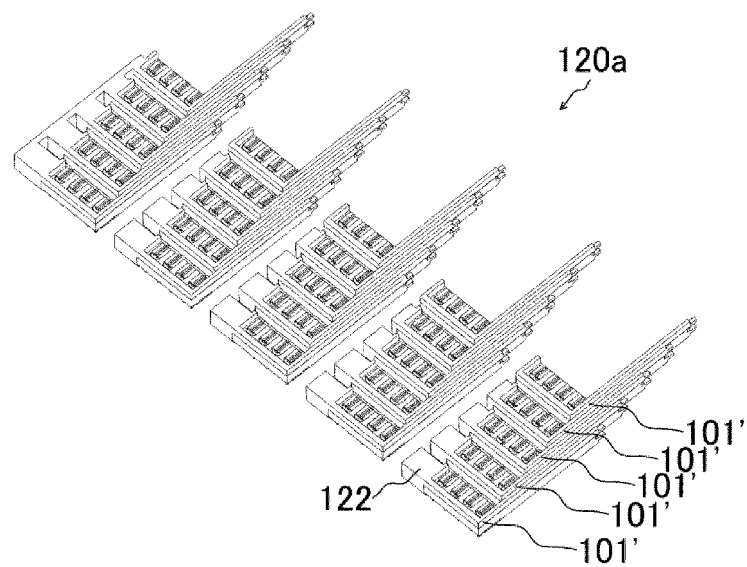
FIG. 2C is a perspective view showing the state of the package in a middle step so as to explain the manufacturing method of the package according to the second embodiment of the present invention.
Figure 2D:
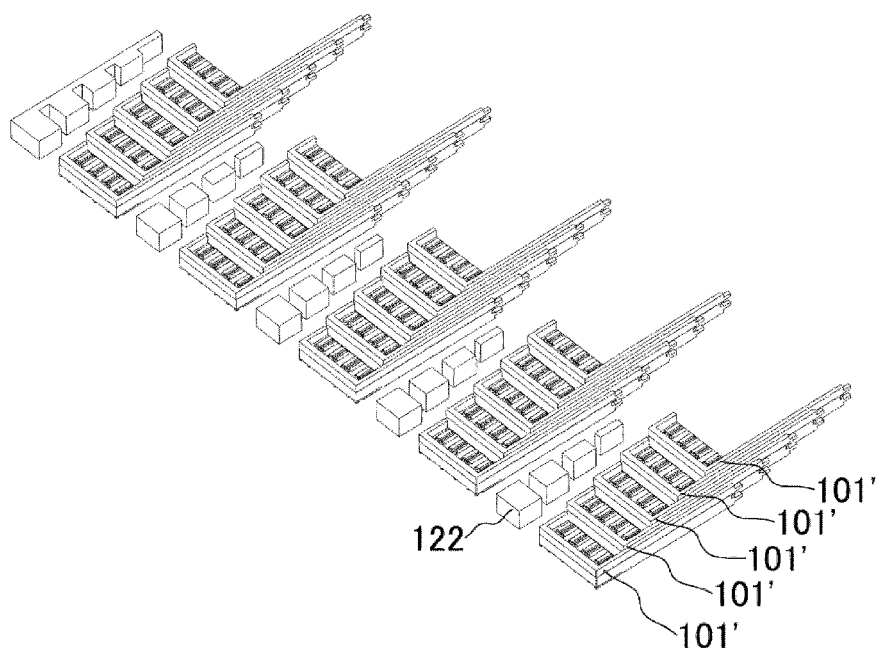
FIG. 2D is a perspective view showing the state of the package in a middle step so as to explain the manufacturing method of the package according to the second embodiment of the present invention.
Figure 2E:
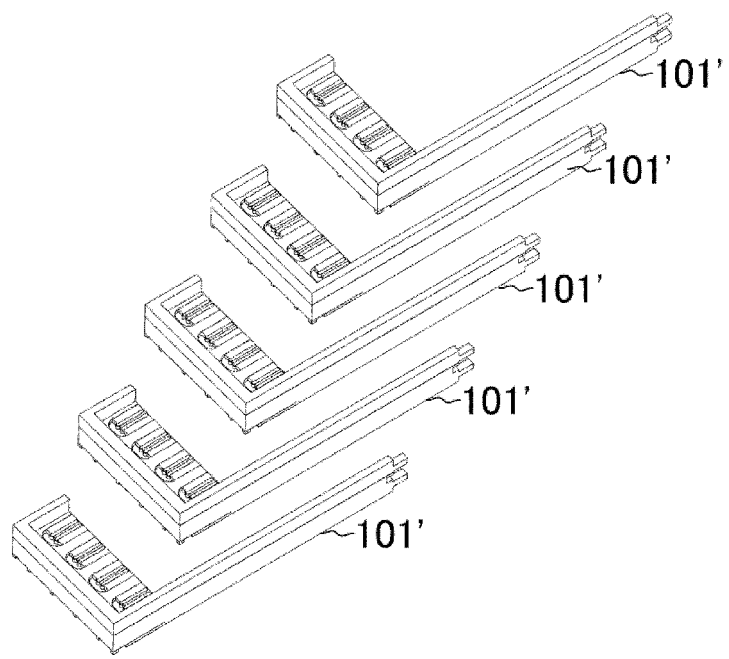
FIG. 2E is a perspective view showing the state of the package in a middle step so as to explain the manufacturing method of the package according to the second embodiment of the present invention.

The thus produced assembly 120a is divided into a plurality of parts, for example, as shown in FIG. 2C, and each of the divided parts of the assembly 120a is divided into the frame assemblies 121a by separating the connecting portions 122 (FIG. 2D). As a result, as shown in FIG. 2E, the first frame 101' having an "L" shape in a planar view can be produced. The first frame 101' is formed by a sintered body in which layers of ceramic and conductor layers are stacked.

Figure 2F:
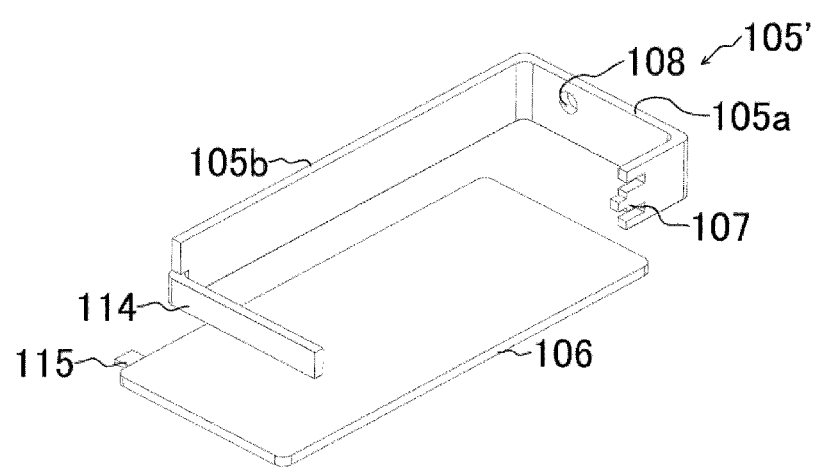
FIG. 2F is a perspective view showing the state of the package in a middle step so as to explain the manufacturing method of the package according to the second embodiment of the present invention.

Next, as shown in FIG. 2F, a second frame 105' having an "L" shape in a planar view and including a second short side surface 105a, a second long side surface 105b, and a spacer 114 is produced. The second short side surface 105a and the second long side surface 105b are, for example, perpendicular to each other in a planar view. In this example, the second frame 105' includes a second joint 107 used to join the first frame 101'. Also, in the second frame 105', the second short side surface 105a includes a through hole 108. The through hole 108 can be used as an optical signal input/output window for an optical module stored (mounted) in the package. Note that the spacer 114 and the second frame 105' can be integrated, or can be formed separately.

In addition, a plate-shaped base material 106 serving as a floor portion is produced. In the second embodiment, the base material 106 includes a flange 115 as a thin flat projection structure. The second frame 105', the spacer 114, and the base material 106 can be made of, for example, an alloy of Kovar and nickel. In addition, from the viewpoint of heat dissipation, the base material 106 can also be made of an alloy of copper and tungsten. The flange 115 is not limited to one, and a plurality of flanges can be provided on the side of the second short side surface and the side of the second long side surface of the base material 106 in a state in which the flanges match the bottom surface position of the base material 106.

Figure 2G:
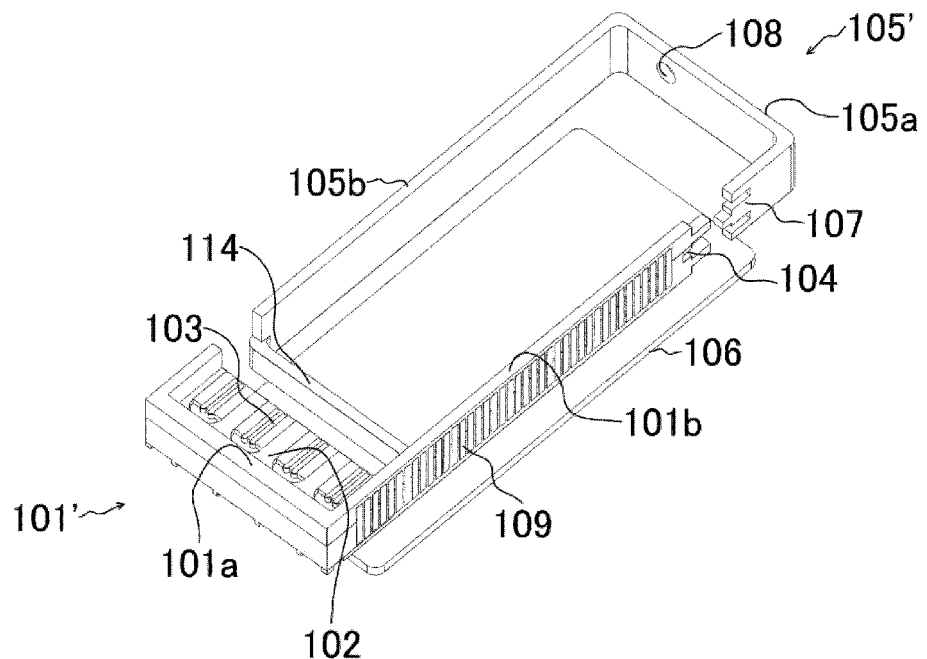
FIG. 2G is a perspective view showing the state of the package in a middle step so as to explain the manufacturing method of the package according to the second embodiment of the present invention.

Next, as shown in FIG. 2G, a plurality of DC electrode terminals 109 are formed on the outer surface of the first long side surface 101b. Here, the frame assembly 121a includes the portions of a first short side surface 101a and a first long side surface 101b, and the first short side surface iota and the first long side surface 101b are, for example, perpendicular to each other in a planar view.

In the first frame 101', a plurality of conductor layers to which the plurality of DC electrode terminals 109 are connected, and a plurality of insulating layers arranged between the plurality of conductor layers are stacked. In addition, a plurality of high-frequency internal terminals 103 are formed in the internal terminal portion 102 on the inner side of the first short side surface iota. Also, in this example, each first frame 101' includes a first joint 104 used to join the second frame 105' (to be described later).

Figure 2H:
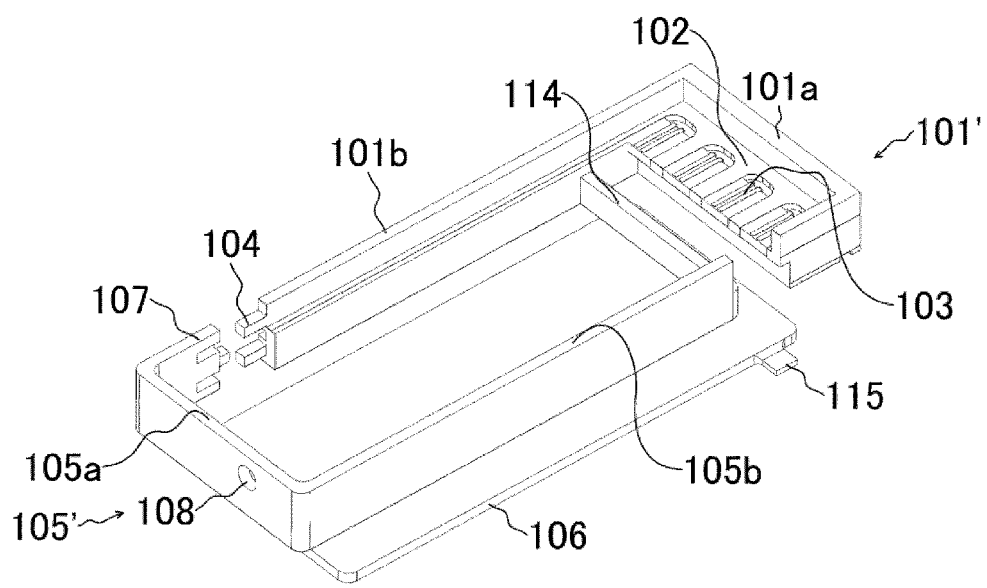
FIG. 2H is a perspective view showing the state of the package in a middle step so as to explain the manufacturing method of the package according to the second embodiment of the present invention.
Figure 2I:
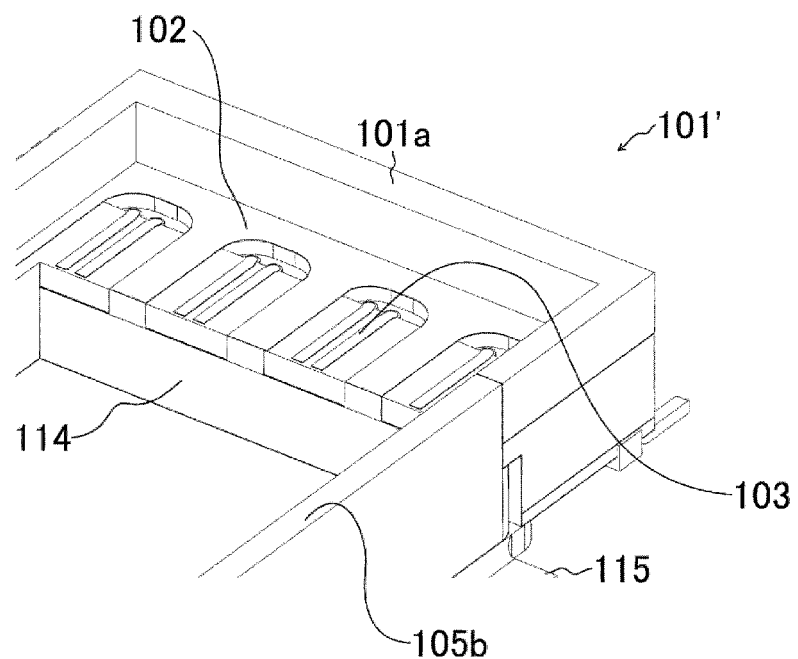
FIG. 2I is a perspective view showing the state of the package in a middle step so as to explain the manufacturing method of the package according to the second embodiment of the present invention.

Next, as shown in FIGS. 2H and 2I, the first frame 101', the second frame 105', the base material 106, and the spacer 114 are combined to form a package. In this example, the first joint 104 of the first frame 101' and the second joint 107 of the second frame 105' are tenon-jointed, thereby combining the first frame 101' and the second frame 105'. Also, in this example, the spacer 114 is arranged between the internal terminal portion 102 and the base material 106.

In addition, a conductor layer is formed on the lower surface of the internal terminal portion 102, which the spacer 114 contacts, and these can be rendered conductive. Hence, the internal terminal portion 102 is provided with a plurality of Grounded-GSSG differential high-frequency line ends (high-frequency internal terminals 103), and the line ends and an electronic device mounted inside are electrically connected to each other to propagate a high-frequency signal. Since the spacer 114 and the ground conductor thin film surface inside the package are electrically connected, the ground potential that forms the GSSG differential high-frequency line ends can reliably match the package ground, and it is expected that the high-frequency characteristic of the package can stably be obtained. More specifically, this contributes to reduction of crosstalk between the plurality of GSSG differential high-frequency lines.

Here, the package includes a rectangular floor portion 106a including a long side and a short side, the first short side surface iota and the second short side surface 105a arranged on the portions of the short sides of the floor portion 106a, and the first long side surface 101b and the second long side surface 105b arranged on the portions of the long sides of the floor portion 106a. The first short side surface 101a and the second short side surface 105a are arranged on the portions of the two short sides of the floor portion 106a, which are in an opposite position to each other. The first long side surface 101b and the second long side surface 105b are arranged on the portions of the two long sides of the floor portion 106a, which are in an opposite position to each other.

Also, the package includes the plurality of high-frequency internal terminals 103 arrayed in the internal terminal portion 102 on the inner side of the first short side surface iota and connected to the stored element. In addition, the package includes a plurality of high-frequency external terminals (not shown) arrayed in a first external terminal portion on the outer side of the floor portion 106a on the side of the first short side surface iota and connected to the high-frequency internal terminals 103 and connected to lead pins. In addition, the package includes the plurality of DC electrode terminals 109 arrayed in a second external terminal portion on the outer side of the first long side surface 101b.

As described above, in the first frame 101' of package, a plurality of conductor layers to which the plurality of DC electrode terminals 109 are connected, and a plurality of insulating layers arranged between the plurality of conductor layers are stacked, as in the above-described first embodiment. Further, the second frame 105' includes the portions of the second short side surface 105a and the second long side surface 105b, and does not have a structure including alternately stacked insulating layers and conductor layers.

In the package according to the second embodiment as well, a high-frequency optical device or an optical component can be mounted in a bathtub structure on the floor portion 106a surrounded by the first frame 101' and the second frame 105', as in the above-described first embodiment.

Figure 2J:
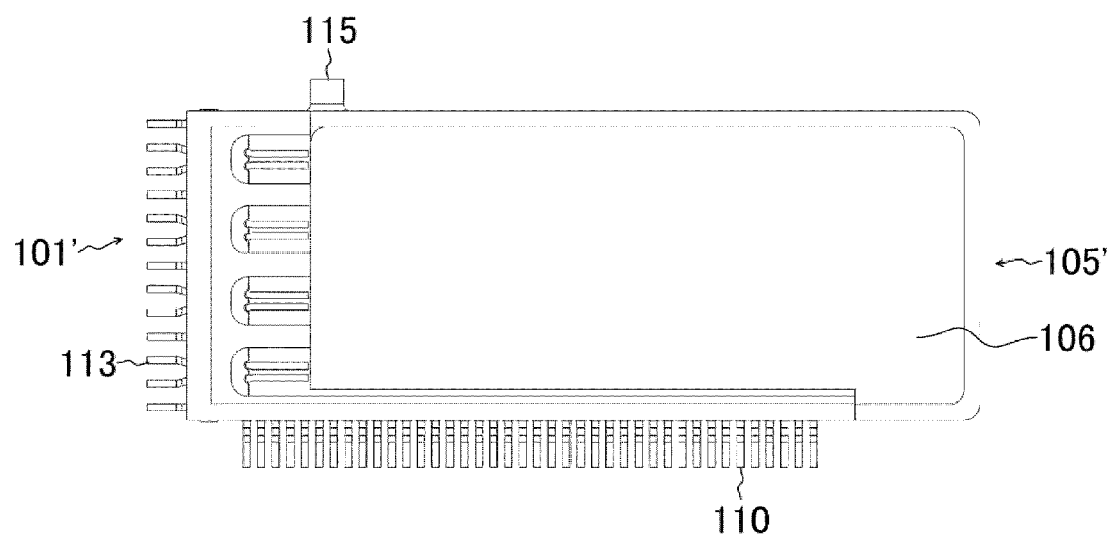
FIG. 2J is a plan view showing the state of the package in a middle step so as to explain the manufacturing method of the package according to the second embodiment of the present invention.
Figure 3:
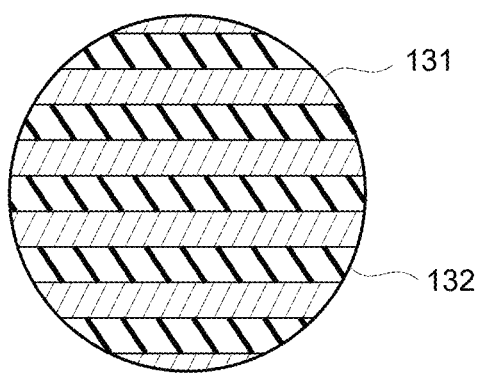
FIG. 3 is an enlarged cross-sectional view showing a part of the first frame.

Note that as shown in FIG. 2J, DC lead pins 110 are connected to the plurality of DC electrode terminals 109. In addition, a plurality of high-frequency external terminals 112 are arrayed in a first external terminal portion 111 on the outer side of the floor portion 106a on the side of the first short side surface 101a, and RF lead pins 113 are connected to the plurality of high-frequency external terminals 112.

As described above, according to the second embodiment, the multilayer structure of the plurality of conductor layers and the plurality of insulating layers is formed only in the portion of the first frame. It is therefore possible to manufacture a package of CDM at a lower cost.

Also, in the second embodiment, the base material 106 includes the flange 115. It is therefore possible to suppress generation of a stress load on the lead pins and solder when mounting the package on a mounting board to mount it.

For example, when an optical module including a high-frequency optical device or an optical component mounted in the package is mounted on a mounting board, solder mounting is performed in general. RF lead pins or DC lead pins are fixed on the mounting board by solder. Generally, the linear expansion coefficient of the mounting board is larger than that of the package. For this reason, if the mounting board thermally expands or shrinks along with a change of the environmental temperature, a stress load to the lead pins and the solder that fixes the lead pins is generated in an area where the solder mounting density of the lead pins is relatively low. In the worst case, these are ruptured to make the RF lead pins open, and propagation of a high-frequency signal is impeded.

Against the above-described problem, the flange integrated with the base material is used. When the flange is connected and fixed to the mounting board by solder or the like, generation of the above-described stress load can be suppressed. Hence, the RF lead pins can be prevented from being open, and an optical module that is stable against the change of the environmental temperature can be provided.

As described above, according to the present invention, since the multilayer structure of the plurality of conductor layers and the plurality of insulating layers forms the portion of the first frame, a package of CDM can be manufactured at a lower cost.

Note that the present invention is not limited to the above-described embodiments, and it should be appreciated that many modifications and combinations can be made within the technical scope of the present invention.

REFERENCE NUMERALS AND SIGNS

101 . . . first frame
101a . . . first short side surface
101b . . . first long side surface
102 . . . internal terminal portion
103 . . . high-frequency internal terminal
104 . . . first joint
105 . . . second frame
105a . . . second short side surface
105b . . . second long side surface
106 . . . base material
107 . . . second joint
108 . . . through hole
109 . . . DC electrode terminal
110 . . . DC lead pin
111 . . . first external terminal portion
112 . . . high-frequency external terminal
113 . . . RF lead pin
120 . . . assembly
121 . . . frame assembly

The invention claimed is:

1. A method of manufacturing a package,
the package comprising:
a rectangular floor portion comprising two long sides, which are in opposite position to each other, and two short sides, which are in opposite position to each other, a first short side surface and a second short side surface arranged on respective portions of the two short sides of the rectangular floor portion, and a first long side surface and a second long side surface arranged on respective portions of the two long sides of the rectangular floor portion;
a plurality of high-frequency internal terminals arrayed in an internal terminal portion on an inner side of the first short side surface, the high-frequency internal terminals connected to a high-frequency optical device mounted inside the package;
a plurality of high-frequency external terminals arrayed in a first external terminal portion on an outer side of the rectangular floor portion and on an outer side of the first short side surface, the high-frequency external terminals connected to the high-frequency internal terminals and connected to lead pins; and
a plurality of DC electrode terminals arrayed in a second external terminal portion on an outer side of the first long side surface,
the method comprising:
producing a first frame having an "L" shape in a planar view and comprising portions of the first short side surface and the first long side surface, a part of the second long side surface, and the internal terminal portion, the first frame including conductor layers and insulating layers, the conductor layers and the insulating layers being stacked alternately, the conductor layers being connected to the plurality of DC electrode terminals, a length of the portion of the first long side surface in a first direction parallel to a longitudinal direction of the first long side surface being longer than a length of the internal terminal portion in the first direction, and a length of the part of the second long side surface in the first direction being substantially the same as the length of the internal terminal portion in the first direction;

producing a second frame having an "L" shape in the planar view and comprising portions of the second short side surface and the second long side surface;

producing a plate-shaped base material serving as the rectangular floor portion; and combining the first frame, the second frame, and the plate-shaped base material to form the package.

2. The method of manufacturing the package of claim 1, wherein producing the first frame comprises:

producing a frame assembly in which two first frames rotated by 180° with respect to each other in the planar view are integrated; and dividing the frame assembly into the two first frames, thereby producing the first frame.

3. The method of manufacturing the package of claim 2, wherein producing the frame assembly comprises:

producing an assembly in which a plurality of frame assemblies are integrated; and dividing the assembly into the frame assemblies, thereby producing the frame assembly.

4. The method of manufacturing the package of claim 1, wherein producing the first frame comprises:

producing a frame assembly in which a plurality of first frames are stacked and integrated by connecting portions while holding such a positional relationship that the first frames are translated in a direction of the long side of the package in the planar view such that the internal terminal portion is visible from the outside; and removing the connecting portions to divide the frame assembly into the first frames, thereby producing the first frame.

5. The method of manufacturing the package of claim 4, wherein producing the frame assembly comprises:

producing an assembly in which a plurality of frame assemblies are integrated; and dividing the assembly into the frame assemblies, thereby producing the frame assembly.

6. The method of manufacturing the package of claim 1, wherein combining the first frame, the second frame, and the plate-shaped base material comprises:

combining the first frame, the second frame, the plate-shaped base material, and a spacer to form the package, the spacer arranged between the internal terminal portion and the plate-shaped base material.

7. The method of manufacturing the package of claim 6, wherein the spacer is integrated with the second frame.

8. The method of manufacturing the package of claim 1, wherein:

the first frame comprises a first joint provided in a joint portion to the second frame, the second frame comprises a second joint provided in a joint portion to the first frame, and combining the first frame, the second frame, and the plate-shaped base material comprises joining the first joint of the first frame and the second joint of the second frame with tenon joints, thereby combining the first frame and the second frame.

9. The method of manufacturing the package of claim 1, wherein:

the first frame comprises a first joint surface provided in a joint portion to the second frame, the second frame comprises a second joint surface provided in a joint portion to the first frame, and combining the first frame, the second frame, and the plate-shaped base material comprises permanently joining the first joint surface of the first frame and the second joint surface of the second frame, thereby combining the first frame and the second frame.

10. The method of manufacturing the package of claim 1, wherein the plate-shaped base material comprises, on a side of the second short side surface and a side of the second long side surface, at least one thin flat projection structure that matches a bottom surface position of the plate-shaped base material.

11. A package comprising:

a rectangular floor portion comprising two long sides, which are in opposite position to each other, and two short sides, which are in opposite position to each other, a first short side surface and a second short side surface arranged on respective portions of the two short sides of the rectangular floor portion, and a first long side surface and a second long side surface arranged on respective portions of the two long sides of the rectangular floor portion;

a plurality of high-frequency internal terminals arrayed in an internal terminal portion on an inner side of the first short side surface, the high-frequency internal terminals connected to a high-frequency optical device mounted inside the package;

a plurality of high-frequency external terminals arrayed in a first external terminal portion on an outer side of the rectangular floor portion and on an outer side of the first short side surface, the high-frequency external terminals connected to the high-frequency internal terminals and connected to lead pins;

a plurality of DC electrode terminals arrayed in a second external terminal portion on an outer side of the first long side surface;

a first frame having an "L" shape in a planar view and comprising portions of the first short side surface and the first long side surface, a part of the second long side surface, and the internal terminal portion, the first frame including conductor layers and insulating layers, the conductor layers and the insulating layers being stacked alternately, the conductor layers being connected to the plurality of DC electrode terminals, a length of the portion of the first long side surface in a first direction parallel to a longitudinal direction of the first long side surface being longer than a length of the internal terminal portion in the first direction, and a length of the part of the second long side surface in the first direction being substantially the same as the length of the internal terminal portion in the first direction;

a second frame having an "L" shape in the planar view and comprising portions of the second short side surface and the second long side surface; and a plate-shaped base material serving as the rectangular floor portion.

12. The package of claim 11 further comprising:

a spacer arranged between the internal terminal portion and the plate-shaped base material.

13. The package of claim 12, wherein the spacer is integrated with the second frame.

14. The package of claim 11, wherein:

the first frame comprises a first joint provided in a joint portion to the second frame, the second frame comprises a second joint provided in a joint portion to the first frame, and the first joint of the first frame and the second joint of the second frame are tenon-jointed.

15. The package of claim 11, wherein:
the first frame comprises a first joint surface provided in a joint portion to the second frame,
the second frame comprises a second joint surface provided in a joint portion to the first frame, and
the first joint surface of the first frame and the second joint surface of the second frame are permanently jointed.

16. A method for manufacturing a package, the method comprising:
producing a first frame having a first short side surface and a first long side surface, wherein the first frame is formed by stacking alternating conductor layers and insulating layers, the conductor layers comprising a first metal;
shaping the first frame to form an "L" shape in a planar view, wherein the first short side surface and the first long side surface are perpendicular to each other, the first frame comprising portions of the first short side surface and the first long side surface, a part of a second long side surface, and an internal terminal portion, a length of the portion of the first long side surface in a first direction parallel to a longitudinal direction of the first long side surface being longer than a length of the internal terminal portion in the first direction, and a length of the part of the second long side surface in the first direction being substantially the same as the length of the internal terminal portion in the first direction;
producing a second frame having a second short side surface and the second long side surface forming an "L" shape in the planar view, the second frame comprising a second metal and comprising a portion of the second short side surface and the other part of the second long side surface;
producing a rectangular base comprising the second metal; and
combining the first frame, the second frame, and the rectangular base to form a package, the first short side surface and the second short side surface arranged on respective short sides of the rectangular base, the first long side surface and the second long side surface arranged on respective long sides of the rectangular base, the short sides of the rectangular base in an opposite position to each other, the long sides of the rectangular base in an opposite position to each other.

17. The method of claim 16 further comprising:
arraying DC electrode terminals on an outer side of the first long side surface of the first frame, the DC electrode terminals connected to the conductor layers of the first frame.

18. The method of claim 16 further comprising:
arraying high-frequency internal terminals on an inner side of the first short side surface, the high-frequency internal terminals connected to a high-frequency optical device mounted inside the package.

19. The method of claim 18 further comprising:
arraying high-frequency external terminals on an outer side of the rectangular base and on an outer side of the first short side surface, the high-frequency external terminals connected to the high-frequency internal terminals.

20. The method of claim 16, wherein the second frame does not comprise a stack of conductor layers.

* * * * *